(12) United States Patent
Hisaka

(10) Patent No.: US 7,429,780 B2
(45) Date of Patent: Sep. 30, 2008

(54) FUSE CIRCUIT AND SEMICONDUCTOR DEVICE INCLUDING THE SAME

(75) Inventor: Katsuhiro Hisaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/673,392

(22) Filed: Sep. 30, 2003

(65) Prior Publication Data

US 2005/0067669 A1    Mar. 31, 2005

(51) Int. Cl.
*H01L 29/72* (2006.01)
(52) U.S. Cl. .............. 257/529; 257/536; 257/537; 257/773; 337/159; 337/297
(58) Field of Classification Search .............. 257/528, 257/529, 531, 536, 537, 773; 337/159, 297
See application file for complete search history.

(56) References Cited

U.S. PATENT DOCUMENTS

| | | | | |
|---|---|---|---|---|
| 4,331,947 A | * | 5/1982 | Noerholm | 337/159 |
| 5,726,621 A | * | 3/1998 | Whitney et al. | 337/297 |
| 6,853,050 B2 | * | 2/2005 | Kim | 257/529 |
| 2002/0060352 A1 | * | 5/2002 | Mizuno | 257/537 |
| 2002/0079552 A1 | * | 6/2002 | Koike | 257/529 |
| 2003/0038338 A1 | * | 2/2003 | Fournel et al. | 257/529 |
| 2004/0038458 A1 | * | 2/2004 | Marr | 438/132 |
| 2004/0046231 A1 | * | 3/2004 | Okada | 257/529 |

FOREIGN PATENT DOCUMENTS

JP    05-021604    1/1993
JP    2001-298093    10/2001

* cited by examiner

*Primary Examiner*—Edward Wojciechowicz
(74) *Attorney, Agent, or Firm*—Rabin & Berdo, PC

(57) ABSTRACT

A semiconductor device includes a fuse circuit, which includes a first conductive region and a second conductive region. The first conductive region has a multi-layered structure, and the second conductive region has a less layered structure than the first conductive region.

16 Claims, 5 Drawing Sheets

FUSE CIRCUIT AND SEMICONDUCTOR DEVICE INCLUDING THE SAME

TECHNICAL FIELD OF THE INVENTION

The present invention relates to a semiconductor device having a fuse circuit therein.

BACKGROUND OF THE INVENTION

A conventional fuse circuit formed in a semiconductor device includes a conductive line and a pair of electrodes, connected to the ends of the conductive line. The conductive line in a disconnection region, which is shaped to be narrower or thinner and is disconnected easily. The conductive line may be made of metal. In operation, a predetermined voltage is applied between the electrodes so that a predetermined current flows through the conductive line. When a specific increased amount of current flows through the conductive line, the disconnection region will melt and become disconnected.

According to the above described conventional fuse circuit, particles of the conductive line may be left over on the fuse circuit or on the semiconductor device. As a result, a reliability of the fuse circuit and the semiconductor device is decreased.

OBJECTS OF THE INVENTION

Accordingly, it is an object of the present invention to provide a semiconductor device in which a reliability of a fuse circuit is improved.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a semiconductor device includes a fuse circuit, which includes a first conductive region and a second conductive region. The first conductive region has a multi-layered structure, and the second conductive region has a less layered structure than the first conductive region.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
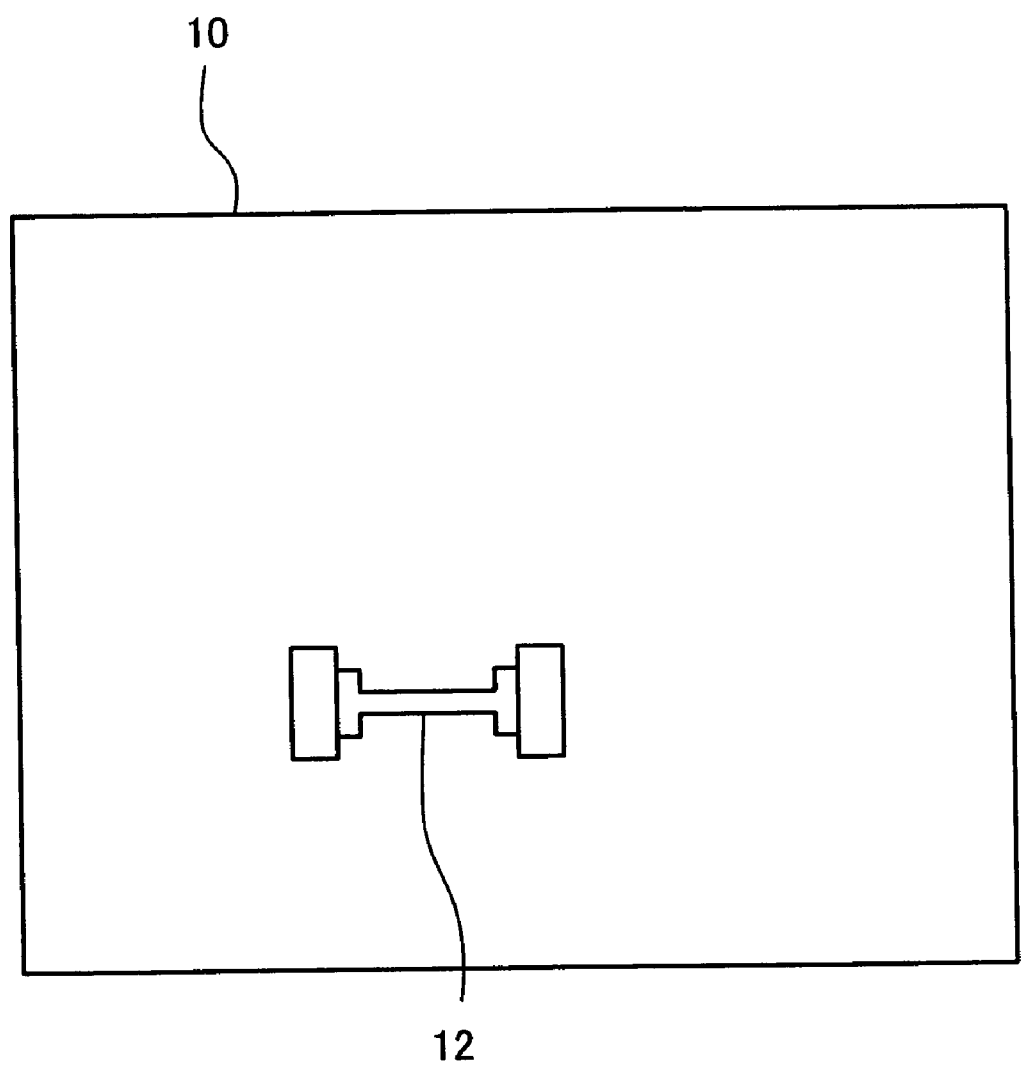
FIG. 1 is a block diagram illustrating the whole image of a semiconductor device according to a first preferred embodiment of the present invention.

FIG. 1 is a block diagram illustrating the whole image of a semiconductor device according to a first preferred embodiment of the present invention. A semiconductor device 10 includes at least one fuse circuit 12 therein. The fuse circuit 12 may be a redundant fuse; a fuse used for adjusting a resistance and/or capacity; a fuse used for switching logic circuits in the semiconductor device 10; and a fuse used of adjusting an output level of signal. The present invention is applicable to various kinds of semiconductor devices.

Figure 2A:
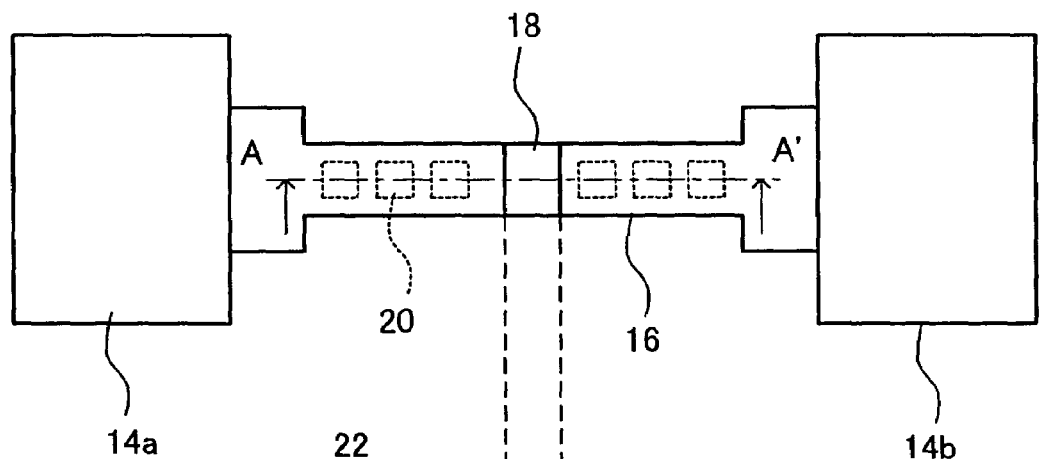
FIG. 2A is an enlarged plan view illustrating a fuse circuit according to the first preferred embodiment.
Figure 2B:
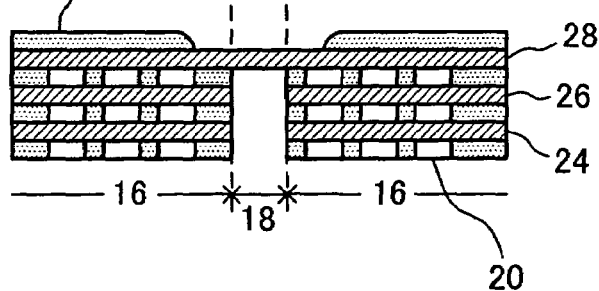
FIG. 2B is a cross-sectional view taken on line A-A' in FIG. 2A.

FIG. 2A is an enlarged plan view illustrating the fuse circuit 12 formed on a semiconductor substrate according to the first preferred embodiment. FIG. 2B is a cross-sectional view taken on line A-A' in FIG. 2A. The fuse circuit 12 includes a pair of electrode pads 14a and 14b; and a conductive line (16 & 18) connected between the electrode pads 14a and 14b. The conductive line (16 & 18) may be made of metal, such as Al and Cu, multicrystal silicon, and tungsten siliside (Wsix).

From a plan view, the conductive line includes a first conductive region 16 and a second conductive region 18. As shown, the conductive regions form a bridge structure, with the second conductive region being suspended over the semiconductor substrate, i.e., with a space being formed therebetween. On the other hand, from a layered structure view (cross-sectional view), the conductive line (16 & 18) includes first to thirds conductive layers 24, 26 and 28, and a passivation layer 22 as shown in FIG. 2B. The passivation layer 22 is not formed over the second conductive region 18. In the first conductive region 16, through holes 20 are formed in interlayer insulating layers. The second conductive region 18 includes the upper most layer 28.

The first conductive region 16 has a multi-layered structure, as shown in FIG. 2B, in order to reduce the current density thereat. The second conductive region 18 has a single layer structure as shown in FIG. 2B, in order to increase the current density thereat. The second conductive region 18 may have a multi-layered structure, but should be less layered (i.e., have fewer layers) than the first conductive region 16. For instance, the first conductive region 16 can have more than four layers and the second conductive region 18 may be a double-layered structure. According to the present invention, the second conductive region (disconnection region) 18 may be disconnected selectively and reliably, because electric current tends to be concentrated on the second conductive region 18. As a result, a fuse circuit can be designed small in size on a semiconductor substrate.

Figure 3:
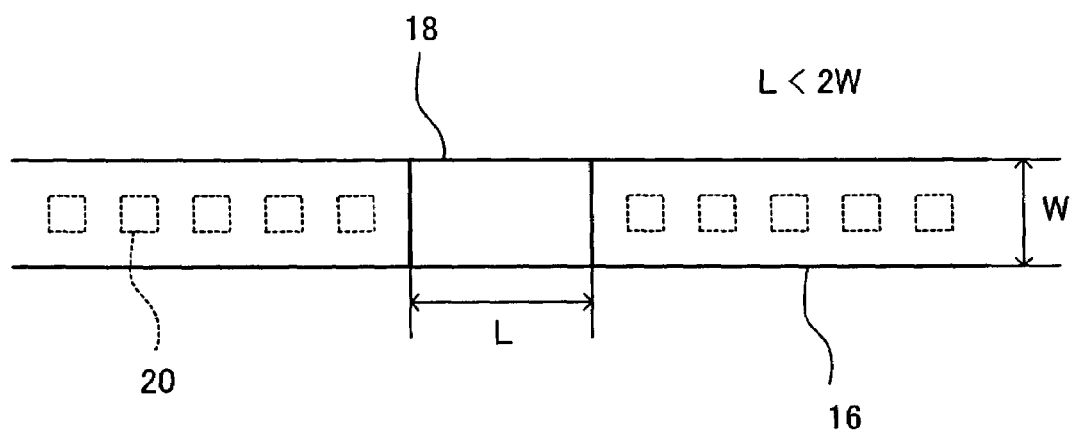
FIG. 3 is an explanatory diagram showing a specific design of the fuse circuit according to the first preferred embodiment.

FIG. 3 is an explanatory diagram showing a specific design of the fuse circuit 12. A length "L" of the second conductive region 18 is designed not to be larger than a double of a width "W" of the conductive line (16) for better fabrication process. If the length "L" of the second conductive region 18 is longer than "2W", the selectivity of fuse disconnection would be decreased.

Figure 4:
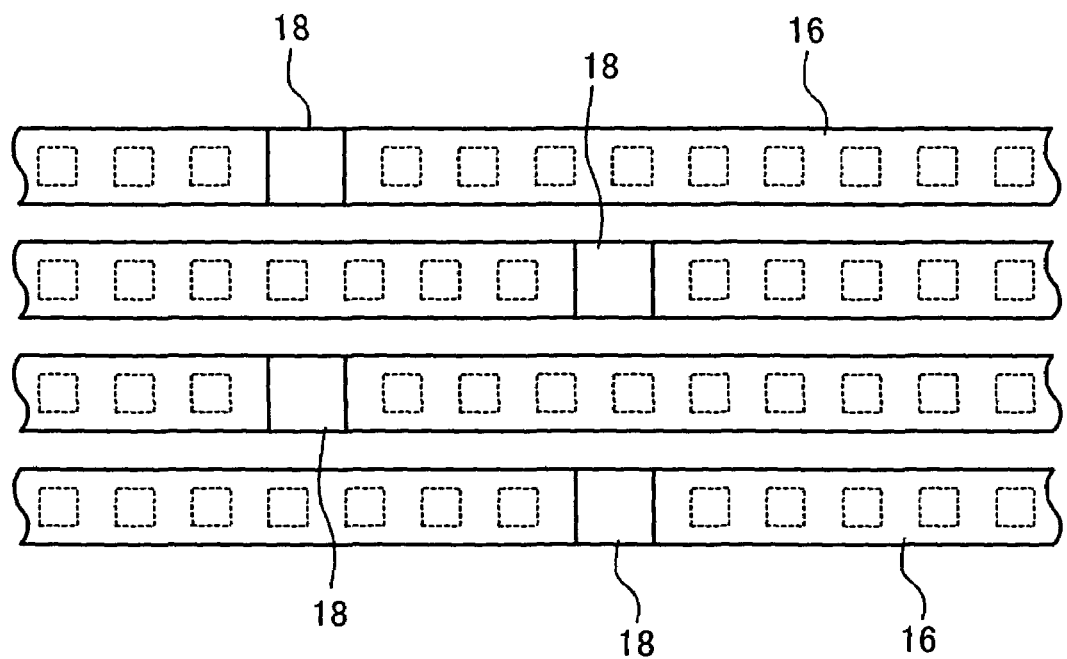
FIG. 4 is an explanatory diagram showing an arrangement of fuse circuit according to the present invention.

FIG. 4 is an explanatory diagram showing an arrangement of fuse circuits according to the present invention. A plurality of conductive lines (16+18) are arranged in parallel to each other and the second conductive regions 18 are not located adjacent one another. In other words, the second conductive regions 18 are arranged alternately as shown in FIG. 4.

In operation, when a predetermined voltage is applied between the electrode pads 14a and 14b, electric current flows through the conductive line (16 & 18). When a predetermined amount of electric current flows through the second conductive region 18, the region 18 is melted and disconnected.

Figure 5:
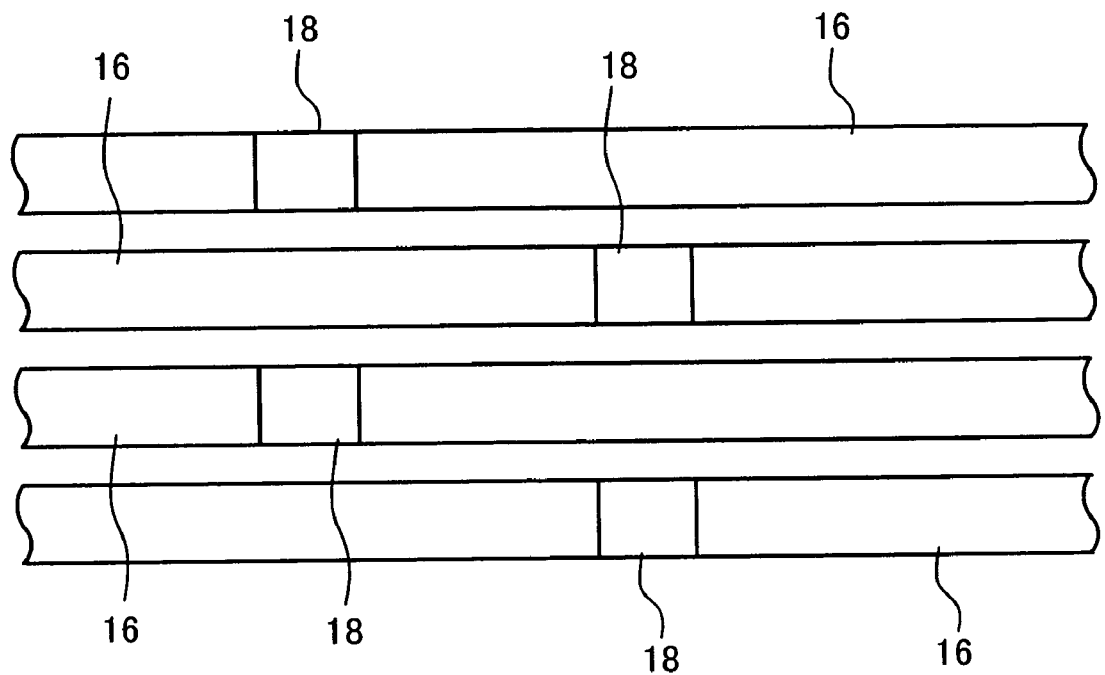
FIG. 5 is an explanatory diagram showing an arrangement of fuse circuit according to a second preferred embodiment of the present invention.

FIG. 5 is an explanatory diagram showing an arrangement of a fuse circuit according to a second preferred embodiment of the present invention. FIG. 5 corresponds to FIG. 4. The fuse circuit is of a laser trimming type. In other words, a laser beam is applied to the second conductive region 18 in order to disconnect it. The other structure and operation is almost the same as the first preferred embodiment, and the same description is not repeated to avoid redundancy. According to the second preferred embodiment, shown in FIG. 5, the second conductive regions 18 are arranged alternately, so that a laser beam can be applied to a specific region 18 reliably. In other words, unnecessary regions are prevented from being disconnected accidentally. As a result, the conductive lines can be arranged with a smaller pitch or distance.

What is claimed is:

1. A semiconductor device, comprising:
a semiconductor substrate; and
a fuse circuit disposed on the semiconductor substrate, and which comprises a first conductive region and a second conductive region,
wherein the first conductive region has a multi-layered structure, and the second conductive region has a less layered structure than the first conductive region;
wherein the first conductive region include a plurality of conductive layers, and a respective interlayer insulating layer disposed between respective adjacent ones of the conductive layers;
wherein said fuse circuit comprises first and second electrode pads, and a conductive line extending from said first electrode pad to said second electrode pad, said first conductive region and said second conductive region collectively forming said conductive line, and being disposed between said first and second electrode pads; and
wherein electric current flows from said first conductive pad, through the conductive line, and to said second conductive pad, respectively, and wherein when the electric current exceeds a threshold level, the second conductive region melts, to prevent the flow of the electric current.

2. A semiconductor device according to claim 1, wherein the second conductive region is formed to have a single layer structure.

3. A semiconductor device according to claim 1, wherein no passivation layer is formed over the second conductive region.

4. A semiconductor device according to claim 1, comprising:
a plurality of the fuse circuits, which are arranged so that the second conductive regions are not located adjacent one another.

5. A semiconductor device, comprising:
a semiconductor substrate; and
a fuse circuit disposed on the semiconductor substrate, and which comprises a first conductive region and a second conductive region,
wherein the first conductive region has a multi-layered structure, and the second conductive region has a less layered structure than the first conductive region;
wherein the first conductive region includes two separate, spaced-apart regions, each having a plurality of conductive layers, and a respective interlayer insulating layer disposed between respective adjacent ones of the conductive layers;
wherein the second conductive region is disposed between the two separate, spaced-apart regions, and extends from one of the two separate, spaced-apart regions to the other one of the two separate, spaced-apart regions;
wherein said fuse circuit comprises first and second electrode pads, and a conductive line extending from said first electrode pad to said second electrode pad, said first conductive region and said second conductive region collectively forming said conductive line, and being disposed between said first and second electrode pads; and
wherein an entire length of the second conductive region along the conductive line, and between the two spaced-apart regions, is formed not to be larger than a double of a narrowest width of the conductive line in the second conductive region.

6. A semiconductor device according to claim 1, wherein the fuse circuit is provided with through holes in the first conductive region to connect the layers to each other.

7. A semiconductor device according to claim 6, wherein a predetermined voltage is applied between the first and second electrode pads in order to disconnect the second conductive region.

8. A semiconductor device according to claim 1, wherein a laser beam is applied to the second conductive region in order to disconnect it.

9. A semiconductor device according to claim 1, wherein the fuse circuit is applicable to one selected from a redundant fuse in a semiconductor device; a fuse adjusting a resistance and/or capacity in a semiconductor device; a fuse used for switching logic circuits in a semiconductor device; and a fuse used for adjusting an output level of signal in a semiconductor device.

10. A semiconductor device according to claim 1, wherein the first conductive region and the second conductive region form a bridge structure, with the second conductive region extending over the semiconductor substrate so as to be suspended thereabove.

11. A semiconductor device according to claim 10, wherein the conductive line in the second conductive region has no layers on an upper surface thereof.

12. A semiconductor device according, comprising:
a semiconductor substrate; and
a fuse circuit disposed on the semiconductor substrate, and which comprises a first conductive region and a second conductive region,
wherein the first conductive region has a multi-layered structure, and the second conductive region has a less layered structure than the first conductive region;
wherein the first conductive region include a plurality of conductive layers, and a respective interlayer insulating layer disposed between respective adjacent ones of the conductive layers;
wherein said fuse circuit comprises first and second electrode pads, and a conductive line extending from said first electrode pad to said second electrode pad, said first conductive region and said second conductive region collectively forming said conductive line, and being disposed between said first and second electrode pads; and wherein the first conductive region and the second conductive region form a bridge structure, with the second conductive region being an upper layer that is suspended over the semiconductor substrate.

13. A semiconductor device according to claim 12, wherein the conductive line in the second conductive region has no layers on an upper surface thereof.

14. A semiconductor device according to claim 1, wherein a lower surface of the second conductive region is not in direct contact with any layers therebelow.

15. A semiconductor device according to claim 1, wherein the conductive line forms an uppermost layer of the second conductive region.

16. A semiconductor device according to claim 5, wherein the conductive line forms an uppermost layer of the second conductive region.

* * * * *